(12) United States Patent
Becker

(10) Patent No.: US 6,331,495 B1
(45) Date of Patent: Dec. 18, 2001

(54) SEMICONDUCTOR STRUCTURE USEFUL IN A SELF-ALIGNED CONTACT ETCH AND METHOD FOR MAKING SAME

(75) Inventor: David S. Becker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/457,995

(22) Filed: Dec. 9, 1999

Related U.S. Application Data

(62) Division of application No. 09/010,666, filed on Jan. 22, 1998, now Pat. No. 6,018,184.

(51) Int. Cl.[7] .................................................. H07L 21/00
(52) U.S. Cl. .................. 438/774; 438/618; 438/637; 438/689; 438/694; 438/699; 438/706; 438/740; 438/744; 438/758; 156/657
(58) Field of Search ...................................... 438/618, 637, 438/689, 694, 699, 706, 740, 744, 758, 774; 156/657

(56) References Cited

U.S. PATENT DOCUMENTS

| 4,711,701 | 12/1987 | McLevige . | |
|---|---|---|---|
| 5,282,160 | 1/1994 | Yamagata . | |
| 5,286,344 | * 2/1994 | Blalock et al. | 156/657 |
| 5,304,829 | 4/1994 | Mori et al. . | |
| 5,604,367 | 2/1997 | Yang . | |
| 5,869,403 | 2/1999 | Becker et al. . | |
| 5,880,036 | * 3/1999 | Becker et al. | 438/740 |
| 5,885,895 | * 3/1999 | Liu et al. | 438/637 |
| 5,933,755 | * 8/1999 | Lee | 438/634 |
| 6,018,184 | 1/2000 | Becker . | |
| 6,117,767 | * 9/2000 | Howard | 438/637 |

OTHER PUBLICATIONS

Wolf, Silicon Processing for the VLSI Era, vol. 2–Process Integration, p. 234, fig. 4–32.*
S.M. Sze, VLSI Technology, (Second Edition), McGraw–Hill, New York, 1988, pp. 253, 254, and 259.

* cited by examiner

Primary Examiner—Charles Bowers
Assistant Examiner—Lisa Kilday
(74) Attorney, Agent, or Firm—Hugh R. Kress; Winstead Sechrest & Minick P.C.

(57) ABSTRACT

A semiconductor processing method is provided for making contact openings. It includes depositing several insulative layers and performing an anisotropic etch. One layer is a conformal oxide covering the contact area and adjacent structures. A second layer is a breadloafed oxide deposited over the contact area and adjacent structures. A third layer is a doped oxide deposited over the two lower layers. The anisotropic etch is performed through the oxide layers to the contact area located on a lower substrate. The etch is selectively more rapid in the third oxide than in the two other oxides. The breadloafed oxide provides additional protection and reduces the risk of etch-through to conductive structures adjacent the contact area. An alternate embodiment replaces the two lowest oxide layers by a breadloafed nitride layer. In this embodiment, the anisotropic etch is selectively more rapid in oxides than in nitrides.

35 Claims, 4 Drawing Sheets

SEMICONDUCTOR STRUCTURE USEFUL IN A SELF-ALIGNED CONTACT ETCH AND METHOD FOR MAKING SAME

This is a divisional of co-pending application Ser. No. 09/010,666, filed Jan. 22, 1998 now U.S. Pat. No. 6,018,184.

BACKGROUND OF THE INVENTION

1. Field of the Invention

The present invention relates generally to semiconductor structures and methods of forming semiconductor structures, and, more particularly, to structures and methods of forming structures useful in self-aligned contact etches.

2. Description of Related Art

In the fabrication of multilayered integrated circuits, it is frequently desirable to etch a vertical opening in a layer overlying a substrate to form electrical contacts to the substrate. This commonly requires etching through several layers of different types of overlying material. To assure that electrical contact is made with only the substrate, other structures, such as transistor gates, are enclosed in insulating sidewalls and caps that provide a degree of correction or self-alignment to the etch process. One problem in the prior art is that the etching process attacks these insulating surfaces to some extent. If the etch penetrates the insulating surfaces, subsequent deposition of conductive material will short-circuit different layers of the device.

FIGS. 1–4 illustrate various stages of the process in the prior art. The drawings represent vertical sections of the same semiconductor structure 10. FIG. 1 shows the structure 10 prior to the contact etch. The goal of the process is to attach a contact to the lower substrate 12, typically a semiconductor substrate, in a location 13 positioned adjacent two multilayered structures 14. The multilayered structures 14 can be, for example, comprised of doped polysilicon 16 and silicide 18. The silicide 18 is typically a tungsten silicide. Both the polysilicon 16 and silicide 18 are conductive and together may form, for example, a transistor gate. Insulative layers, such as caps 20 and sidewalls 22 formed of nitride, cover the surfaces and sides of the conducting layers 16 and 18. A uniform, conformal $SiO_2$ coating 24 covers both the outer surface of the raised structures 14 and the underlying substrate 12. The $SiO_2$ layer 24 is typically produced by a low pressure chemical vapor deposition (LPCVD) of tetraethyloxysilane (TEOS). The $SiO_2$ layer 24 conforms itself to the underlying topography. A layer of borophosphosilicate glass (BPSG), or another doped oxide such as phosphosilicate glass (PSG), 26 covers the $SiO_2$ layer 24.

The $SiO_2$ layer 24 acts as a barrier resistant to the migration of dopants from the BPSG layer 26 into the multilayered structures 14 and substrate 12. The prior art has unsuccessfully attempted to use "breadloafed" oxide deposits as diffusion barriers between BPSG and underlying conducting regions. These oxides have proven to be inferior for such purposes when they are the only insulator between the BPSG layer 26 and the transistor gate 16, 18. The breadloafing deposition technique produces a coating that does not conform to the underlying topography, producing an oxide that is thicker at upper corners of structures such as transistor gates, and which is undesirably thin in lower corners and bottoms of tight areas. Accordingly, the prior art has avoided the use of breadloafed oxides in favor of more desirable conformal oxides.

FIG. 2 shows the structure 10 after a successful vertical etch through the BPSG 26 and the $SiO_2$ 24 layers. The insulating caps 20 and sidewalls 22 act to guide, or self-align, the etch process to form an opening 28 that makes contact with the underlying substrate 12 on a contact area 30 situated adjacent the multilayered structures 14. This is accomplished by using a chemistry that will etch oxides at a much faster rate than nitrides, such as a low pressure mixture of $CHF_3$—Ar—$CF_4$ with the additive $CH_2F_2$. The subsequent deposition of a conducting material, such as a metal, onto the surface of the semiconductor structure 10 forms a contact that fills the opening 28. The etching process also invariably erodes away some of the sidewall material 22, leaving a thinner insulating layer 32. To avoid a short-circuit between the conducting regions 18, 16 and the contact, the etch must not break through the sidewalls 22 of FIG. 1. The original sidewall protection of the silicide conductive layer 18 is thinnest along line 34 in FIG. 1, and thus the risk of sidewall breach is highest in that region. After etching, the sidewall insulation 22 is thinnest near the point 36 in FIG. 2.

FIG. 3 shows an unsuccessful etch of the semiconductor structure 10 in which a sidewall breach 38 exposes the conducting region 18. The sidewall breach 38 will result in a short-circuit when the conductive material is subsequently deposited in the contact opening 28. The breach occurred in the region where the original sidewalls were thinnest. This failure can happen due to over-etching, misalignment of the etching mask, or by choosing an etchant that is not suitably selective for oxides. Sidewall breach is a problem for the prior art and is exacerbated by the continual evolution to smaller semiconductor structures. That is, as the structures become smaller, sidewall structures become even thinner and, thus, more prone to sidewall breach.

One method used by the prior art to avoid sidewall breach involves etching vertical openings that are narrower than the space between adjacent sidewalls 32. The use of narrower openings, however, puts undesirable constraints on photomask alignment. Furthermore, alignment problems are exacerbated as the semiconductor structures are miniaturized. Smaller semiconductor structures have a smaller margin of error in alignment and in timing of the duration of the etching process.

FIG. 4 illustrates an alternative prior art method to avoid sidewall breaches. This procedure reduces the risk of sidewall breach by employing a two-step etching process. The starting structure is similar to that of FIG. 1. The first etch proceeds anisotropically under conditions assuring that the BPSG layer 26 is removed more rapidly than the $SiO_2$ layer 24. This step terminates before the $SiO_2$ layer 24 is completely removed. The second step is an isotropic wet etch, which uses an etchant that removes the $SiO_2$ layer 24 more rapidly than the nitride sidewalls 22. Accordingly, the second etch exposes the conductive substrate 44 before a sidewall breach occurs. This two-step etch process is undesirable because it is time consuming, costly and unnecessarily complicates the process, increasing the risk that errors will occur. The isotropic etch also runs the risk of laterally etching the BPSG layer 26 making the critical dimension W too wide.

The present invention is directed to overcoming, or at least reducing the effects of, one or more of the problems set forth above.

SUMMARY OF THE INVENTION

The invention includes an apparatus having a semiconductor substrate and a contact area on one surface of the substrate. At least one structure is formed on the surface of the substrate adjacent the contact area. An insulative layer extends over at least a portion of the structure. A layer of doped oxide also extends over at least a portion of the structure. An intermediate insulative layer is deposited between the structure and the layer of doped oxide. The intermediate layer has a generally breadloafed form in an area adjacent the structure. The intermediate layer is also resistant to the migration of dopants from the layer of doped oxide into the structure and substrate.

The invention includes a method for making a semiconductor device. The method comprises forming a semiconductor substrate. At least one structure is formed on the surface of the substrate. A first insulative layer is formed over at least a portion of the structure. A second insulative layer, having a generally breadloafed form, is formed over at least a portion of the structure and substrate. The second insulative layer is a also a barrier to the migration of dopants. A layer of doped oxide is formed over the first and second insulative layers.

BRIEF DESCRIPTION OF THE DRAWINGS

The foregoing and other advantages of the invention will become apparent upon reading the following detailed description and upon reference to the drawings in which.

Figure 1:
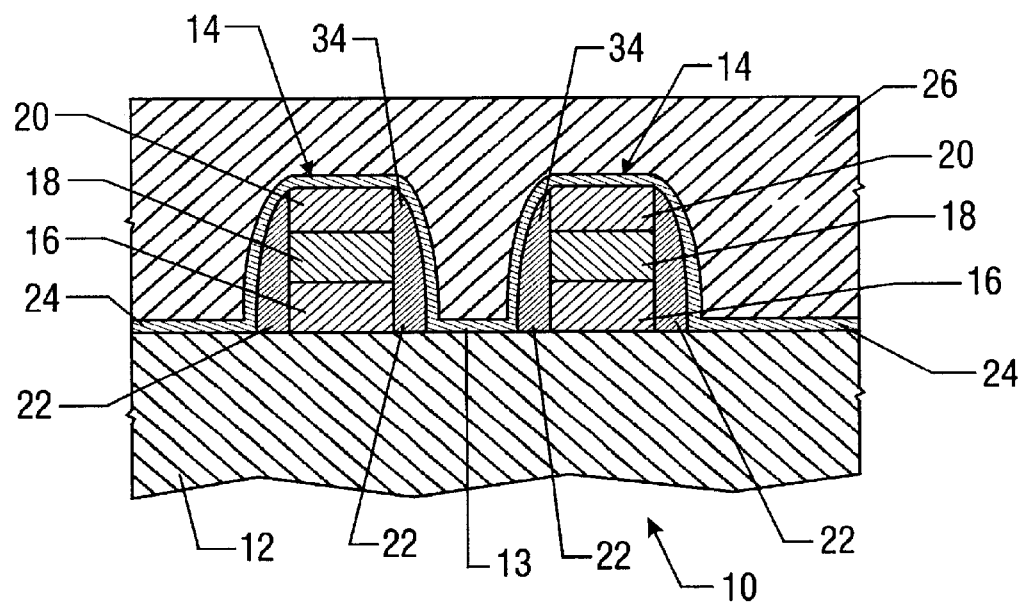
FIG. 1 is a diagrammatic cross-sectional view of a semiconductor wafer of the prior art before the anisotropic etching has been performed.
Figure 2:
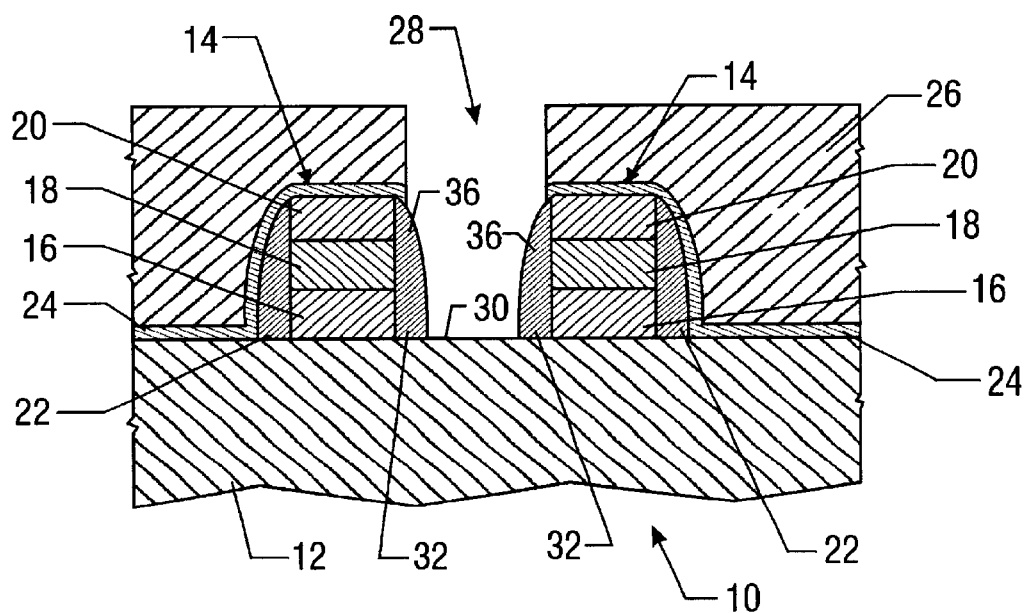
FIG. 2 is a diagrammatic cross-sectional view of the semiconductor wafer of FIG. 1 after anisotropic etching has been performed.
Figure 3:
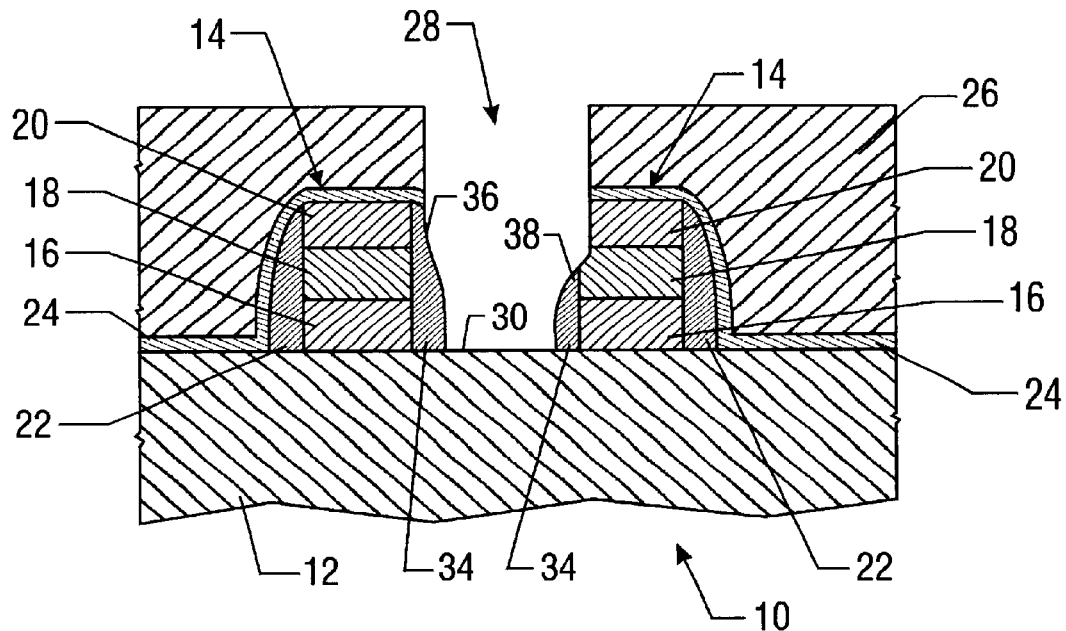
FIG. 3 is a diagrammatic cross-sectional view of the semiconductor wafer of FIG. 1 prior art showing the problem of sidewall breach.
Figure 4:
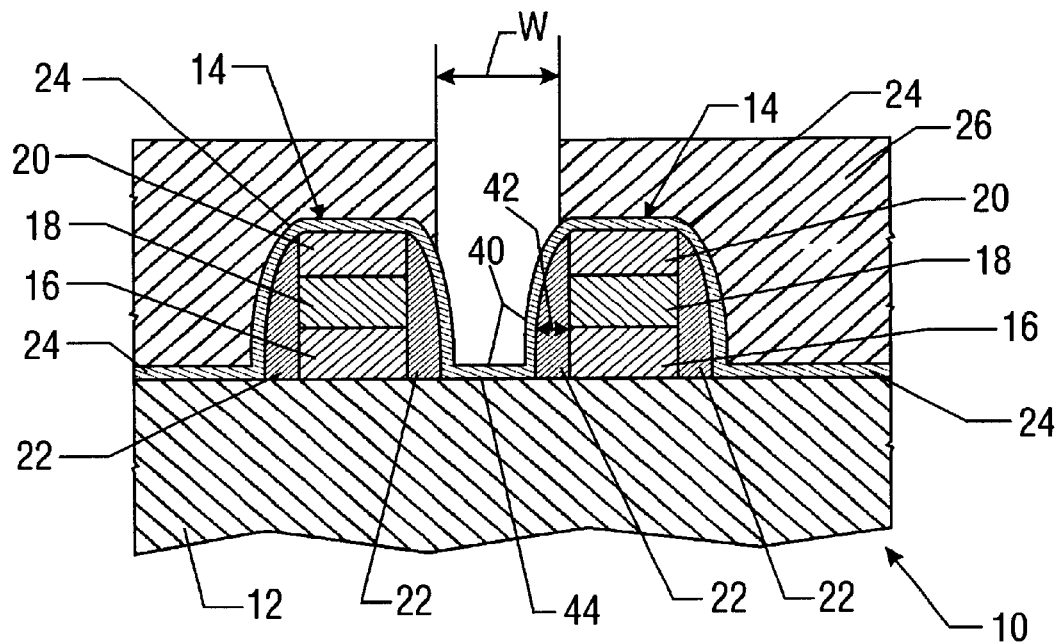
FIG. 4 is a diagrammatic cross-sectional view of a semiconductor wafer after the first etch of a two-step process of the prior art.

While the invention is susceptible to various modifications and alternative forms, specific embodiments have been shown by way of example in the drawings and will be described in detail herein. However, it should be understood that the invention is not intended to be limited to the particular forms disclosed. Rather, the intention is to cover all modifications, equivalents and alternatives falling within the spirit and scope of the invention as defined by the appended claims.

DESCRIPTION OF ILLUSTRATIVE EMBODIMENTS

The following examples are included to demonstrate preferred embodiments of the invention. It should be appreciated by those skilled in the art that the techniques disclosed in the examples that follow represent techniques discovered by the inventor to function well in the practice of the invention, and thus can be considered to constitute preferred modes for its practice. However, those skilled in the art should, in light of the present disclosure, appreciate that many changes can be made in the specific embodiments disclosed herein and still obtain a like or similar result without departing from the spirit and scope of the invention.

Figure 5:
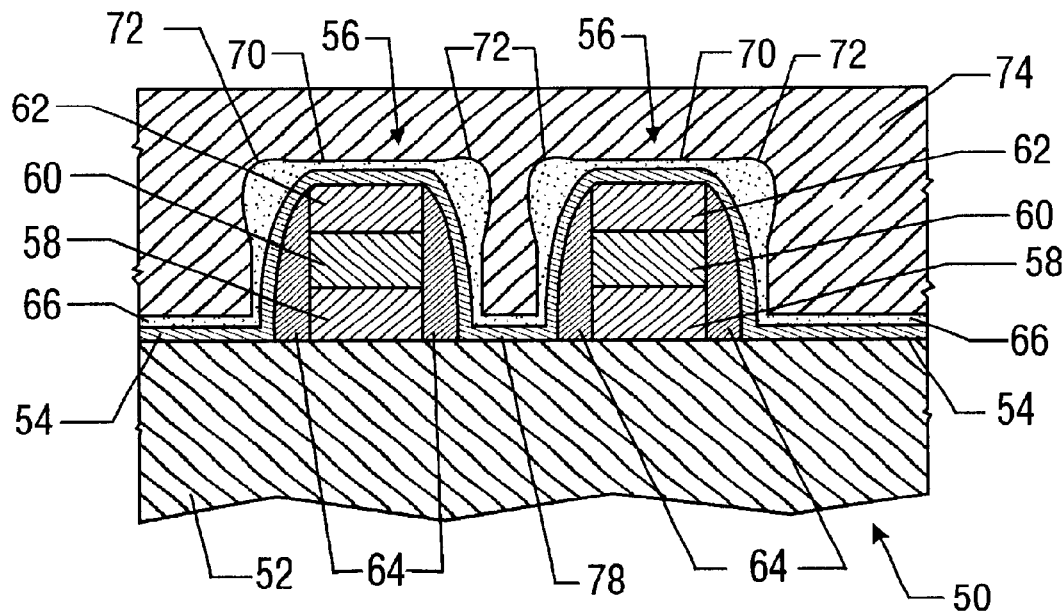
FIG. 5 is a diagrammatic cross-sectional view of one embodiment of a semiconductor wafer employing the invention before a self-aligned contact (SAC) etching process.

Referring to FIG. 5, a portion of a semiconductor wafer 50 is shown. The wafer 50 has a substrate 52 with a top surface 54 on which conventional patterning and etching has formed two multilayered structures 56. The substrate 50 may be any suitable material known to the art and may be a wafer or a previously deposited oxide layer. The multilayered structures 56 contain various conductive layers 58, 60 of doped polysilicon and silicide respectively. In one embodiment, the silicide layer 60 is tungsten silicide. The multilayered structures 56 illustrated herein are transistor gates; however, the scope of the invention includes all manner of integrated circuit structures regardless of construction. The type of integrated circuit structure is immaterial to the practice of the instant invention.

The layers 58 and 60 of the structures 56 are covered by an insulator or insulative layer. In a preferred embodiment, the insulative layer includes caps 62 and sidewalls 64 of nitride. The nitride caps and sidewalls 62, 64, are the result of prior depositions and etchings using known techniques. The caps 62 and sidewalls 64 can be formed from other insulative materials, such as $SiO_2$. In that case, the selected first etch process, described below, must be faster in a doped oxide layer 74 than in the insulative material chosen for the caps 62 and sidewalls 64. In the embodiments described herein, the doped oxide can be for example borophosphosilicate glass (BPSG) or another doped oxide, such as phosphosilicate glass (PSG). A series of depositions has covered the surfaces of the layered structures 56 and the substrate 54 with two layers 66, 70. While the layers 66, 70 are illustrated with layer 70 overlaying layer 66, it is envisioned that the order could be reversed without departing from the spirit and scope of the invention.

The first layer 66 is a generally conformal, undoped layer of $SiO_2$ having a thickness in the range of about 100–300 Angstroms. One known method for depositing the conformal layer 66 of $SiO_2$ uses a low pressure chemical vapor deposition of tetraethyloxysilane (TEOS). In a preferred embodiment, the conformal oxide layer 66 is formed by introducing TEOS vapor into a firnace containing the wafer at a pressure of about 600 mtorr, at a temperature of about 675° C. and for a period of about 10 minutes. Usable ranges of the conditions for the furnace deposition of TEOS vapor include pressures from 400 to 800 mtorr and temperatures from 650 to 750° C.

The second layer 70 is a breadloafed layer of $SiO_2$ or nitride. The layer 70 is not conformal. That is, the thickness of the layer 70 varies with variations in the underlying topography to produce a breadloaf like cross section 72. The breadloafed layers 70 are thicker in regions 72 adjacent vertical surfaces of the multilayered structures 56 that are distant from the top surface 54 of the substrate 52. As is described below, the exact amount of thickening of the breadloafed layer 72 is preferably related to dimensions of and distances between the underlying multi-layered structures 56. In particular, the layer 70 is thicker adjacent the upper corner area of the underlying nitride sidewalls 64. After the deposition of the breadloafed oxide layer 70, a structure is present on the sides of layered structures 56 that has a thickened region 72 along the upper corners of the original nitride sidewalls 64. Thus, layers 66, 70 combine to provide sidewalls that are thicker at the top corners than the original $SiO_2$ layer shown in FIG. 1 as layer 24.

The thickness of the breadloafed layer 70 is dependent on the distance between the outside edges of the two sidewalls 64. For multilayered structures 56 having a height to of about 6500 angstroms, it is preferable that the opening between the outer corners 72 be about 600 and 900 angstroms for oxide and nitride breadloafed layers respectively. When the breadloafed layer 70 is made of undoped oxide as opposed to nitride it must be thicker, because about 300 angstroms of the oxide will be contaminated by dopants from a subsequently applied layer of BPSG 74 during reflow heating. The contaminated part of the $SiO_2$ layer 70 etches more like BPSG than like undoped $SiO_2$. Therefore, breadloafed layers 70 of undoped oxide afford less protection than layers of nitride of equal thickness. If the distance between the sidewalls 64 is 2,000 and 2,500 angstroms at the top and bottom respectively and if the conformal layer 66 is 300 angstroms thick, it is preferable that the opening be about 600 angstroms wide after the breadloafed layer 70 is deposited. For these dimensions, a breadloaf layer 70 of $SiO_2$ should have a thickness of about 400 angstroms measured at the corners 72. In the general case, the deposition thickness of the breadloaf structure 70, 72 will dependent on the size of the opening between the multilayered structures 56 and the material used for the breadloaf layer 70.

Preferably, plasma deposition of low pressure silane gas is used to produce the breadloafed oxide layer 70. An Applied Materials 5000D System is used to perform the deposition. Examples of conditions that result in sufficiently breadloafed deposits are: pressure of 2.2 torr, 205 watts RF power, 400° C. susceptor (347° C. wafer), 65 sccm $SiH_4$, and 2400 sccm $N_2O$. For these conditions, the deposition rate is approximately 97.4 Angstroms per second. Thus, a 1000 Angstrom wide breadloafed deposit takes approximately 10 seconds of running time. Of course, the exact deposition time depends on the size of any underlying structures in the device.

The parameters for the plasma deposition of silane gas are only examples. The values of various parameters such as RF power and pressure can be varied. For example, the deposition rate for the breadloafed layer 70 can be decreased by reducing the gas flow rates. Likewise, increasing pressure and/or RF power tends to enhance the breadloaf effect. Usable parameter ranges for depositing the breadloafed layer are: pressure of about 1.98–2.42 torr, 184–226 watts RF power, 360–440° C. susceptor, 58–72 sccm $SiH_4$, and 2160–2640 sccm $N_2O$. A doped oxide layer 74 of, for example, BPSG covers the lower layers 66, 70 to a thickness of about 8,000–10,000 angstroms above the lower layers 66, 70. The undoped oxide layer 66 acts as a barrier resistant to the migration of dopants from the BPSG layer 74 into the underlying multilayered structures 56 and substrate 52. The dopant percentages in the BPSG are determined from the known thermal properties and the reflow rates desired for the BPSG layer 74. One preferred composition has 6.9% phosphorous and 3.8% boron by weight. One known method of fabrication uses chemical vapor deposition of silane gas in the presence of oxygen. The process is carried out at 450° C. at either low or atmospheric pressure. The addition of diborane and phosphene gases to the other gases produces the dopants in the BPSG layer 74.

Figure 6:
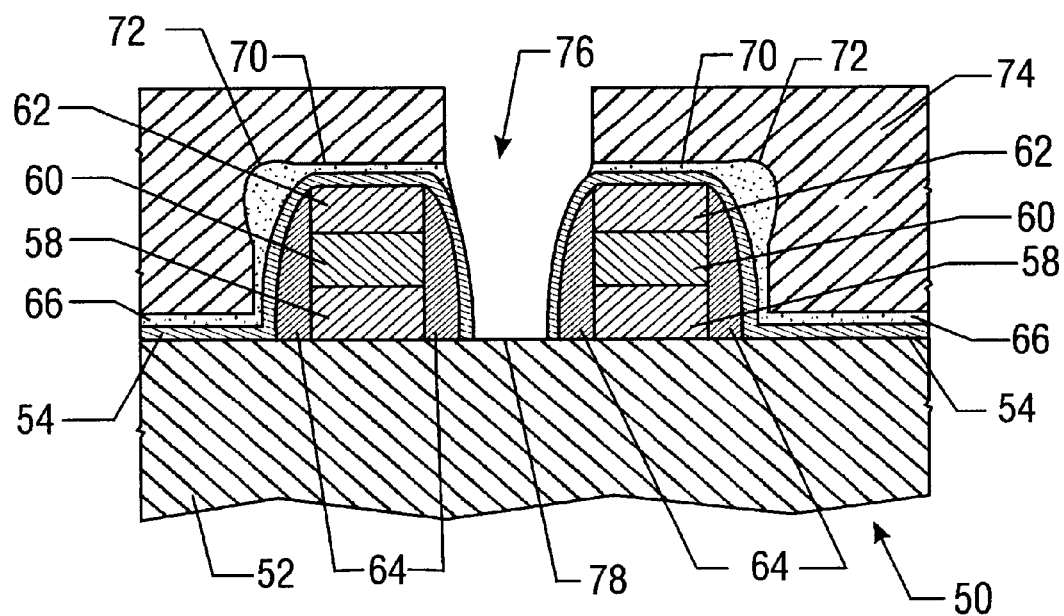
FIG. 6 is a diagrammatic cross-sectional view of the semiconductor wafer of FIG. 5 after the anisotropic SAC etching has been performed.

Referring to FIG. 6, a vertical opening 76 has been masked and etched to provide an access to the lower substrate 52 along the contact area 78. The opening 76 is the result of one or more anisotropic dry etches in the vertical direction. The first and deepest etch generally removes BPSG faster than undoped oxides or nitride. The selectivity of the first etch and the increased width of the upper sidewalls, at the region 72, combine to diminish the risk of sidewall breach. The first etch is timed to terminate after either undoped oxide layer 66 or 70 is exposed over the surface 78. One embodiment uses an Applied Materials 5000 reactor to perform this etch. Appropriate conditions for the anisotropic etch are: pressure of about 45 mtorr, 900 watts RF power, 40 gauss, 20 sccm $CF_4$, 45 sccm $CHF_3$, 20 sccm $CH_2F_2$, 80 sccm Ar, and 9000 mtorr He backside pressure. These conditions result in an etch rate of about 50 angstroms of BPSG per second and a selectivity ratio of BPSG to undoped oxide of at least 10:1. The selectivity ratio of BPSG to undoped $SiO_2$ can be varied by changing the concentration of $CH_2F_2$. Usable ranges for the anisotropic etch conditions include: pressure 35–55 mtorr, 800–1000 watts RF power, 20–60 gauss, 10–30 sccm $CF_4$, 35–55 sccm $CHF_3$, 16–24 sccm $CH_2F_2$, 60–100 sccm Ar, and 4,500–10,000 mtorr He backside pressure.

Figure 8:
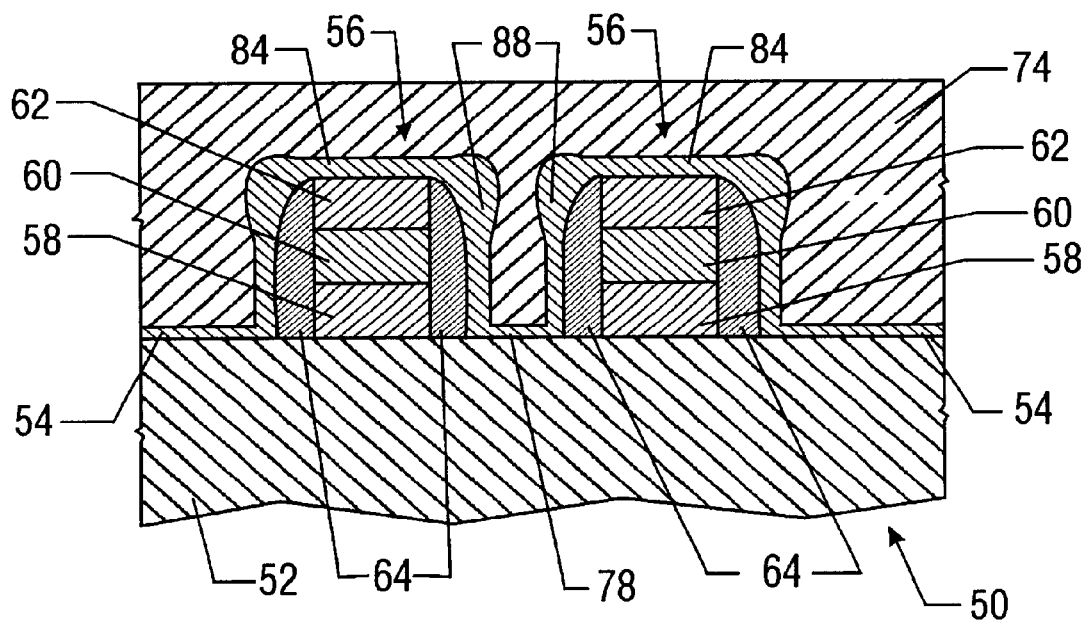
FIG. 8 is a diagrammatic cross-sectional view of a second embodiment of the invention using nitride breadloafed layers before the SAC etching process.

Since the first etch is selectively more rapid in BPSG, a second etch that has, at least, similar etch rates in undoped oxide and BPSG is generally necessary to assure that the contact region 78, FIG. 5, is cleared of the undoped oxide layers 66, 70 (nitride layers in alternate embodiments 84 of FIG. 8). Before the second etch, an $O_2$ clean etch may be used to remove any polymer from the otherwise exposed undoped $SiO_2$ layers 66, 70 (nitride layers in alternate embodiments 84 of FIG. 8). The polymer results from the previous BPSG to undoped oxide selective etch process. The presence of polymer would hamper the ability of the second etch to remove the undoped $SiO_2$ layers 66, 70 (nitride layers in alternate embodiments 84 of FIG. 8). Appropriate conditions for the $O_2$ clean etch are: pressure of about 50 mtorr, 300 watts RF power, 40 gauss, 30 sccm $O_2$, and 9000 mtorr He backside pressure. These conditions result in an etch rate of about 10 angstroms of the polymer per second. Usable ranges for the conditions of the $O_2$ clean etch are: pressure of about 40–60 mtorr, 200–400 watts RF power, 20–60 gauss, 15–45 sccm $O_2$, and 4,500–10,000 mtorr He backside pressure. Once the polymer has been removed, where necessary, the undoped $SiO_2$ layers 66, 70 can be etched away, thereby exposing the substrate surface 78. The second etch is an anisotropic dry etch having a lower selectivity of BPSG to undoped $SiO_2$ and/or nitride than in the first etch. Appropriate condition for this dry etch are: pressure of about 200 mtorr, 600 watts RF power, 100 gauss, 20 sccm $CF_4$, 30 sccm $CHF_3$, and 9000 mtorr He backside pressure. These conditions result in an etch rate of about 54 angstroms of undoped $SiO_2$ per second. Usable ranges for the conditions of the dry etch are: pressure of about 100–300 mtorr, 400–800 watts RF power, 40–100 gauss (preferably not above 100 gauss), 10–40 sccm $CF_4$, 15–45 sccm $CHF_3$, and 4,500–10,000 mtorr He backside pressure. Both the $O_2$ clean etch and the second etch, having a low selectivity of BPSG to undoped oxide and/or nitride are short enough to cause a minimal amount of loss of undoped $SiO_2$ or nitride along the corners 72, sidewalls 64 and caps 62, but long enough to remove the undoped $SiO_2$ layers 66, 70 from the bottom of the contact 78 exposing the substrate 52.

The problem of dopant migration from the BPSG into the underlying undoped layers 66, 70 can change the etching rates of the underlying layers 66, 70 during the above-described first etch. Thus, it may be preferable to deposit the undoped oxide layers 66, 70 in a specific order. The first deposition would be the breadloafed layer. The second deposition would be the 100–300 angstrom conformal layer which thereby overlays the breadloafed layer. The conformal layer can be thicker as long as the opening between the multilayered structures 56 is not closed off. This inverts the order of the two undoped oxide layers 66, 70 of FIG. 5. The last deposition would be the BPSG layer 74. With this arrangement, the conformal layer and not the breadloafed layer risks being contaminated by dopant migration during the subsequent reflow heating of the BPSG layer. During the above-described first etch, the contaminated conformal oxide layer would be removed at close to the same rate as the BPSG layer, but the underlying breadloafed layer would retain its undoped form and etch at a slower rate. For this arrangement, the breadloafed layer still provides protection from sidewall breach even after dopant migration. The second deposition of the conformal layer can be thinner as long as dopant migration from the BPSG layer 74 does not go through the underlying breadloafed layer to contaminate the conductive layers 58, 60 or the substrate 52.

An alternative etch process employs a two-step dry/wet etch. The first etch is vertical and dry. The first etch is terminated before the undoped oxide layer 66 (see FIG. 5) is removed, lowering the risk of a breach through the nitride sidewall 64. Next, an isotropic wet etch is performed with an aqueous solution comprising hydrogen fluoride and having about 10% by weight of a surfactant. Example surfactants can be anionic, cationic, amphoteric, and nonionic. One preferred solution comprises aqueous solution of HF having 0.5% by weight fluorine and about 10% by weight tetra methyl ammonium hydroxide. Usable ranges for the aqueous solution of HF have about 0.30–0.8% by weight fluorine and about 8–12% by weight tetra methyl ammonium hydroxide. The surfactant changes the etching rates, giving a greater etch rate for the undoped oxide layers 70, 66 than for BPSG 74. The breadloafed layer 70 enhances the thickness of undoped oxide on sidewalls 72, as compared to the contact area 78. Thus, the isotropic wet etch can be timed so that the contact area 78 is substantially cleared of oxide before a reach of the thickened insulative protective layer composed of conformal 65 and breadloafed 70 layers, sidewalls 64, and caps 62.

For thick BPSG layers 74, it may be preferable to precede the above-described etching processes by another dry etch having a high selectivity for BPSG. The new etch is terminated at or before the time that it reaches the top of the breadloafed layer 70 of FIG. 5. In an Applied Materials 500 Reactor, exemplary conditions are: pressure of 105 mtorr, 900 watts RF power, 90 gauss, 23 sccm $CF_4$, 50 sccm $CHF_3$, 110 sccm Ar, 30 sccm $N_2$, and 9000 mtorr He backside pressure. These conditions give an etch rate of about 65 angstroms of BPSG per second. Usable parameter ranges for the dry etch having a high selectivity for BPSG are: pressure of about 80–130 mtorr, 700–1100 watts RF power, 60–100 gauss, 18–30 sccm $CF_4$, 30–60 sccm $CHF_3$, 95–125 sccm Ar, 10–50 sccm $N_2$, and 4,500–10,000 mtorr He backside pressure. Normally, this etch is followed by one of the above-mentioned two-step etch processes.

Figure 7:
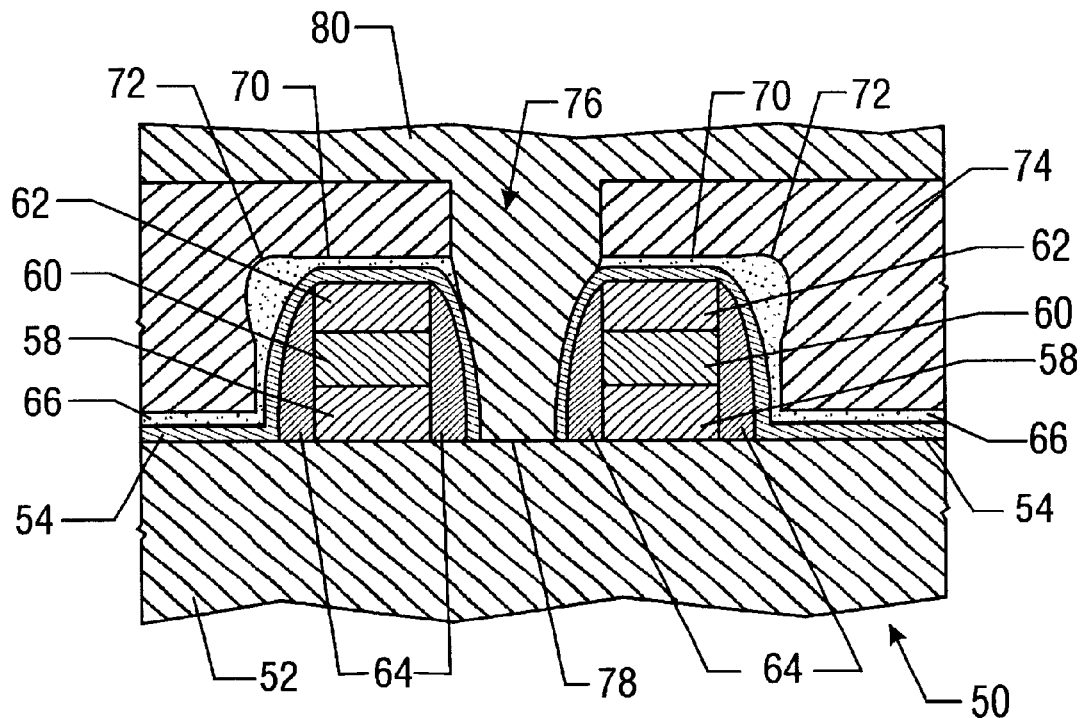
FIG. 7 is a diagrammatic cross-sectional view of the semiconductor wafer of FIG. 6 after a conductive contact layer has been applied.

Referring to FIG. 7, the wafer 50 of FIG. 6 is shown with a layer of conductive material 80 deposited thereover. The conductive material 80 substantially fills the opening 76 to form an electrical connection with the contact area 78. The conductive material 80 can be formed from any of a variety of materials known to those skilled in the art, including but not limited to polysilicon, tungsten, and aluminum, tungsten silicide, and titanium silicide.

Referring now to an alternative embodiment illustrated in FIG. 8, the undoped oxide layers 70, 66 of FIG. 5 are replaced by a single nitride deposit 84. Through the use of a plasma deposition process, the nitride layer 84 has been deposited in a breadloaf form. The single breadloafed nitride layer 84 acts both as a barrier resistant to dopant migration from BPSG and as a stop for the anisotropic contact etch. Thus, the breadloafed nitride layer 84 also replaces the oxide layer 66 of FIG. 5.

The nitride deposition is performed on an Applied Materials 5000D System with the following recipe parameters: 4.2 torr, 735 watts RF power, 400° C. susceptor (375° C. wafer), 275 sccm $SiH_4$, 4000 sccm $N_2$, and 120 sccm $NH_3$. The deposition rate is about 123 Angstroms per second. A usable range for the recipe parameters includes: 3.78–4.62 Torr, 661–809 watts RF power, 360–440° C. susceptor, 247–303 sccm $SiH_4$, 3,600–4,400 sccm $N_2$, and 108–132 sccm $NH_3$. A preferred thickness for the nitride breadloafed layer has been described in the alternate embodiment having a breadloafed layer of is undoped oxide 70, FIG. 5. A deposition of nitride, of the described thickness, also suffices to form a diffusion barrier against dopant contamination from the overlying doped BPSG oxide.

The nitride breadloafed layer 84, as well as the sidewalls 64 and caps 62 together act as a stop for the anisotropic etch. The etch rate should be faster for BPSG than for nitride. As a result of the breadloafing technique, such an etch can again be timed to substantially clear the contact area 78 without breaching the sidewalls 64, caps 62, or breadloafed layer 84. The preferred series of etches are the above-described dry etches for the embodiment using an undoped $SiO_2$ breadloafed layer 70. For that embodiment, the first etch was selectively more rapid in BPSG than in either undoped $SiO_2$ or nitride. The selectivity of BPSG to nitride therein can also be varied by changing the concentration of $CH_2F_2$. A second vertical dry etch having more equal nitride and BPSG etch rates is again generally used to clear the contact region 78. In the Applied Materials 5000 reactor, the recipe for the second etch is: pressure of about 200 mtorr, 600 watts RF power, 100 gauss, 50 sccm $CF_4$, 10 sccm $CHF_3$, and 9000 mtorr He backside pressure. These conditions lead to an etch rate of about 57 angstroms of nitride per second. A usable range for the parameters of the second etch is: pressure of about 100–300 mtorr, 500–700 watts RF power, 60–100 gauss (preferably not above 100 gauss), 30–70 sccm $CF_4$, 5–20 sccm $CHF_3$, and 4,500–10,000 mtorr He backside pressure. Before performing the second dry etch, it may again be useful to substantially clear the nitride layer 84 of polymers by performing the above-described $O_2$ clean etch. The combination of high first etch selectivity for BPSG and the breadloafed reinforcement of the sidewall regions 88 enables the etches to be completed before a sidewall breach occurs.

There is alternative etch recipe for the first anisotropic dry etch that is selectively faster in BPSG than nitride. This recipe makes use of a Lam Research TCP oxide reactor. The Lam device is a high density reactor that uses both an upper and lower RF power. Exemplary conditions for the etch are: pressure of about 3 mtorr, bottom RF power of 1700 watts, top RF power of 1100 watts, 37 sccm $C_2HF_5$, 20 sccm $CHF_3$, 20 sccm $CH_2F_2$, 20 torr He backside pressure. Another LAM Research TCP oxide etch recipe is: pressure of about 5 mtorr, bottom RF power of 1600 watts, top RF power of 1500 watts, 20 sccm $C_2HF_5$, 40 sccm $CHF_3$, 120 sccm Ar, and 20 torr He backside pressure. This second set of conditions gives an etch rate of about 10,000 angstroms per minute.

A preferred method to control the second anisotropic dry etch is to monitor for the presence of silicon in the etch gases and terminate when a sufficient amount of silicon is detected. The appearance of silicon means that the surface of the contact area 78 has been cleared of the nitride layer 84 (undoped oxide layers 66, 70, in the alternate embodiment of FIG. 5). Alternatively, the first dry etch can be timed by its known rates in BPSG and nitride. The relatively high selectivity for BPSG over both nitride and undoped oxide allows one to compensate for irregularities in the thickness of the BPSG layer 74 in estimating the time for the first dry etch.

Finally, several methods have been described for constructing and placing the breadloafed layers 70 and conformal layers 66 that serve as barriers to dopant contamination from the BPSG layer 74. The described constructions have included: a low pressure deposition of breadloafed silane oxide 70 over a conformal oxide layer 66 formed by the furnace deposition of TEOS, FIG. 5; a conformal oxide layer 66 formed by furnace deposition of TEOS over a breadloafed layer 70 formed by low-pressure deposition of silane oxide; and a single step plasma deposition of a breadloafed layer 84 of nitride, FIG. 8. An alternate construction is a 200–300 angstrom thick layer 66 of conformal nitride under a breadloafed upper layer 70 formed by plasma deposition of either silane oxide or nitride. FIG. 5 illustrates this construction, wherein the undoped oxide layer 66 is formed of nitride, and the breadloafed layer 70 is either oxide or nitride. These combinations and others are included within the scope of the present invention under the proviso that one layer gives a sufficient dopant barrier during reflow of the BPSG and one layer has a breadloafed form that protects underlying structures from breach during the deep dry etching. Making rearrangements and combinations of breadloafed and conformal layers, with the above proviso, are within the scope of the present invention and would be routine to workers skilled in the art.

All of the methods and structures disclosed and claimed herein can be made and executed without undue experimentation in light of the present disclosure. While the compositions and methods of this invention have been described in terms of preferred embodiments, it will be apparent to those of skill in the art that variations may be applied to the structures and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method for making a semiconductor device, comprising the steps of:
    forming a semiconductor substrate;
    forming at least one structure on the surface of said substrate;
    forming a first insulative layer over at least a portion of said structure;
    forming a second insulative layer over at least a portion of said structure and substrate, said second insulative layer having a generally nonuniform thickness adjacent said structure and being a barrier to the migration of dopants; and
    forming a layer of doped oxide over said first and second insulative layers.

2. The method, as set forth in claim 1, wherein the step of forming at least one structure includes forming at least one structure having a generally vertical surface relative to said substrate and said step of forming a second insulative layer includes forming a layer that is thicker adjacent said vertical surface and distant from said substrate.

3. The method, as set forth in claim 1, wherein the step of forming a second insulative layer includes forming a layer having a generally breadloafed form such that said second insulative layer is thicker at an upper side region of said structure relative to a lower side region of said structure.

4. The method, as set forth in claim 1, wherein the step of forming the layer of doped oxide includes forming a layer of borophosphosilicate glass.

5. The method, as set forth in claim 1, wherein the step of forming a second insulative layer includes:
    forming a first layer of undoped oxide having a generally uniform thickness; and
    forming a second layer of undoped oxide having a generally breadloafed form such that said second insulative layer is thicker at an upper side region of said structure relative to a lower side region of said structure.

6. The method, as set forth in claim 5, wherein the step of forming the first layer of undoped oxide is performed before the step of forming the second layer of undoped oxide.

7. The method, as set forth in claim 5, wherein the step of forming the second layer of undoped oxide is performed before the step of forming the first layer of undoped oxide.

8. The method, as set forth in claim 5, wherein the step of forming the first layer of undoped oxide includes performing a chemical vapor deposition of tetraethyloxysilane.

9. The method, as set forth in claim 5, wherein the step of forming the second layer of undoped oxide includes performing a plasma deposition of silane gas in the presence of nitrous oxide.

10. The method, as set forth in claim 1, wherein the step of forming a second insulative layer includes:
    first, forming a layer of silicon nitride having a generally uniform thickness; and
    then, forming a layer of undoped oxide having a generally breadloafed form such that said second insulative layer is thicker at an upper side region of said structure relative to a lower side region of said structure.

11. The method, as set forth in claim 1, wherein the step of forming a second insulative layer includes:
    first, forming a layer of undoped oxide having a generally breadloafed form such that said layer of undoped oxide is thicker at an upper side region of said structure relative to a lower side region of said structure; and
    then, forming a layer of silicon nitride having a generally uniform thickness.

12. The method, as set forth in claim 1, wherein the step of forming the second insulative layer includes forming a layer of silicon nitride having a generally breadloafed form such that said layer of silicon nitride is thicker at an upper side region of said structure relative to a lower side region of said structure.

13. The method, as set forth in claim 12, wherein the step of forming the layer of silicon nitride includes performing a plasma deposition of silane gas in the presence of nitrogen gas.

14. The method, as set forth in claim 1, wherein the step of forming the second insulative layer comprises:
    first, forming a layer of silicon nitride having a generally breadloafed form such that said layer of silicon nitride is thicker at an upper side region of said structure relative to a lower side region of said structure; and
    then, forming a layer of undoped oxide having a generally uniform thickness.

15. The method, as set forth in claim 1, wherein the step of forming the second insulative layer comprises:
    first, forming a layer of undoped oxide having a generally uniform thickness; and then, forming a layer of silicon nitride having a generally breadloafed form such that said layer of silicon nitride is thicker at an upper side region of said structure relative to a lower side region of said structure.

16. The method, as set forth in claim 1, wherein the step of forming the first insulative layer includes forming a layer of silicon nitride.

17. The method, as set forth in claim 1, wherein the step of forming the first insulative layer includes forming a layer of undoped oxide.

18. The method, as set forth in claim 1, wherein the step of forming at least one structure includes forming a structure with a semiconductive layer.

19. A method for making a semiconductive device having at least one contact opening therein, comprising the steps of:
   forming a semiconductor substrate having a contact area;
   forming at least one structure on a surface of said substrate;
   forming a conformal layer of undoped oxide over at least a portion of the structure and the substrate;
   forming a breadloafed layer of undoped oxide over at least a portion of the structure and the substrate such that said layer of undoped oxide is thicker at an upper side region of said structure relative to a lower side region of said structure;
   forming a layer of doped oxide over the conformal and breadloafed oxide layers; and
   etching an opening to the contact area of the substrate through the conformal, undoped, and doped oxide layers, said opening being adjacent said structure.

20. The method, as set forth in claim 19, wherein the step of etching includes performing an anisotropic dry etch having a higher speed in doped oxide than in undoped oxide.

21. The method, as set forth in claim 20, wherein the step of performing a dry etch includes applying a fluorinated etchant.

22. The method, as set forth in claim 19, wherein the step of etching comprises:
   first, performing a first anisotropic dry etch having a higher speed in doped oxide than in undoped oxide; and
   then, performing a second anisotropic dry etch, said second anisotropic dry etch having a speed in silicon nitride that is, similar or higher than the speed of said second anisotropic dry etch in doped oxide.

23. The method as set forth in claim 22, further comprising the step of performing an $O_2$ clean etch after the step of performing a first anisotropic dry etch and before the step of performing a second anisotropic dry etch, said $O_2$ clean etch substantially clearing polymer from, at least, part of the etched surface over the contact area.

24. The method, as set forth in claim 19, wherein the step of etching includes:
   performing an anisotropic dry etch proceeding faster in doped oxide than in undoped oxide for a first preselected period of time; and
   performing a wet etch having a higher speed in undoped oxides than in doped oxides or silicon nitride for a second preselected period of time.

25. The method, as set forth in claim 19, wherein the step of forming the conformal layer of undoped oxide layer includes performing a chemical vapor deposition of tetra-ethyloxysilane.

26. The method, as set forth in claim 19, wherein the step of forming the breadloafed layer of undoped oxide includes performing a plasma deposition of silane gas in the presence of nitrous oxide.

27. The method, as set forth in claim 19, wherein the step of forming the doped oxide layer includes forming a layer of borophosphosilicate glass.

28. The method, as set forth in claim 19, wherein the step of forming a breadloafed layer of undoped oxide is performed before the step of forming a conformal layer of undoped oxide.

29. A method for making a semiconductive device having at least one contact opening therein, comprising the steps of:
   forming a semiconductor substrate having a contact area;
   forming at least one structure on a surface of said substrate;
   forming a breadloafed layer of silicon nitride over at least a portion of the structure and the substrate such that said layer of silicon nitride is thicker at an upper side region of said structure relative to a lower side region of said structure;
   forming a layer of doped oxide over the layer of silicon nitride; and
   etching an opening through the layers of silicon nitride and doped oxide layers to the contact area of the substrate, said opening being adjacent said structure.

30. The method, as set forth in claim 29, wherein the step of etching includes performing an anisotropic dry etch having a higher speed in doped oxide than in nitride.

31. The method, as set forth in claim 30, wherein the step of performing a dry etch includes applying a fluorinated etchant.

32. The method, as set forth in claim 29, wherein the step of forming the breadloafed layer includes performing a plasma deposition of silane gas in the presence of nitrogen gas.

33. The method, as set forth in claim 29, wherein the step of forming a doped oxide layer includes forming a layer of borophosphosilicate glass.

34. The method, as set forth in claim 29, wherein the step of etching comprises:
   first, performing a first anisotropic dry etch having a higher speed in doped oxide than in silicon nitride; and
   then, performing a second anisotropic dry etch, said second anisotropic dry etch having a speed in silicon nitride that is, similar or higher than the speed of said second anisotropic dry etch in doped oxide.

35. The method as set forth in claim 34, further comprising the step of performing an $O_2$ clean etch after the step of performing a first anisotropic dry etch and before the step of performing a second anisotropic dry etch, said $O_2$ clean etch substantially clearing polymer from at least, part of the etched surface over the contact area.

* * * * *